US009842797B2

(12) United States Patent
Carpenter et al.

(10) Patent No.: US 9,842,797 B2
(45) Date of Patent: Dec. 12, 2017

(54) STACKED DIE POWER CONVERTER

(71) Applicant: TEXAS INSTRUMENTS INCORPORATED, Dallas, TX (US)

(72) Inventors: Brian A. Carpenter, Cary, NC (US); Christopher Sanzo, Providence, RI (US); William T. Harrison, Apex, NC (US); Alok Lohia, Dallas, TX (US); Matthew D. Romig, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/071,403

(22) Filed: Nov. 4, 2013

(65) Prior Publication Data

US 2014/0061884 A1 Mar. 6, 2014

Related U.S. Application Data (63) Continuation-in-part of application No. 13/041,721, filed on Mar. 7, 2011, now abandoned.

(51) Int. Cl.
| | |
|---|---|
| *H01L 23/495* | (2006.01) |
| *H01L 23/00* | (2006.01) |
| *H01L 25/16* | (2006.01) |
| *H01L 25/07* | (2006.01) |

(52) U.S. Cl.
CPC .... *H01L 23/49575* (2013.01); *H01L 23/4952* (2013.01); *H01L 23/49524* (2013.01); *H01L 23/49562* (2013.01); *H01L 24/37* (2013.01); *H01L 24/41* (2013.01); *H01L 24/49* (2013.01); *H01L 24/73* (2013.01); *H01L 24/40* (2013.01); *H01L 24/48* (2013.01); *H01L 25/074* (2013.01); *H01L 25/16* (2013.01); *H01L 2224/0401* (2013.01); *H01L 2224/04042* (2013.01); *H01L 2224/05554* (2013.01); *H01L 2224/131* (2013.01); *H01L 2224/13147* (2013.01); *H01L 2224/16245* (2013.01); *H01L 2224/2919* (2013.01); *H01L 2224/32145* (2013.01); *H01L 2224/37147* (2013.01); *H01L 2224/40095* (2013.01); *H01L 2224/40106* (2013.01);

(Continued)

(58) Field of Classification Search
CPC .......... H01L 23/49575; H01L 23/4952; H01L 23/49524; H01L 23/49562; H01L 24/37
USPC ....... 257/401, 666, 672, 676, 685, 686, 692, 257/693, 723, 726, 777, 778, 782, 784
See application file for complete search history.

(56) References Cited

U.S. PATENT DOCUMENTS

| | | | |
|---|---|---|---|
| 4,996,587 A * | 2/1991 | Hinrichsmeyer et al. .... | 257/676 |
| 6,747,300 B2 * | 6/2004 | Nadd ................... | H02H 7/0838 |
| | | | 257/288 |

(Continued)

*Primary Examiner* — Ori Nadav
(74) *Attorney, Agent, or Firm* — Jacqueline J. Garner; Charles A. Brill; Frank D. Cimino (57) ABSTRACT

A stacked die power converter package includes a lead frame including a die pad and a plurality of package pins, a first die including a first power transistor switch (first power transistor) attached to the die pad, and a first metal clip attached to one side of the first die. The first metal clip is coupled to at least one package pin. A second die including a second power transistor switch (second power transistor) is attached to another side on the first metal clip. A controller is provided by a controller die attached to a non-conductive layer on the second metal clip on one side of the second die.

10 Claims, 7 Drawing Sheets

(52) U.S. Cl.
CPC ............... *H01L 2224/40245* (2013.01); *H01L 2224/4118* (2013.01); *H01L 2224/48091* (2013.01); *H01L 2224/48145* (2013.01); *H01L 2224/48245* (2013.01); *H01L 2224/48247* (2013.01); *H01L 2224/4917* (2013.01); *H01L 2224/49109* (2013.01); *H01L 2224/73221* (2013.01); *H01L 2224/73253* (2013.01); *H01L 2224/73255* (2013.01); *H01L 2224/73257* (2013.01); *H01L 2224/73265* (2013.01); *H01L 2224/73271* (2013.01); *H01L 2924/00013* (2013.01); *H01L 2924/00014* (2013.01); *H01L 2924/014* (2013.01); *H01L 2924/01029* (2013.01); *H01L 2924/1305* (2013.01); *H01L 2924/13055* (2013.01); *H01L 2924/13062* (2013.01); *H01L 2924/13091* (2013.01); *H01L 2924/1461* (2013.01); *H01L 2924/181* (2013.01); *H01L 2924/30107* (2013.01)

(56) References Cited

U.S. PATENT DOCUMENTS

| | | | |
|---|---|---|---|
| 7,271,477 B2 * | 9/2007 | Saito et al. .................. 257/686 |
| 7,291,869 B2 | 11/2007 | Otremba | |
| 7,569,920 B2 | 8/2009 | Otremba | |
| 7,626,262 B2 | 12/2009 | Otremba | |
| 7,663,217 B2 | 2/2010 | Kim et al. | |
| 7,732,929 B2 * | 6/2010 | Otremba et al. .............. 257/777 |
| 7,800,208 B2 | 9/2010 | Otremba | |
| 7,821,128 B2 * | 10/2010 | Ewe et al. ..................... 257/724 |
| 7,936,054 B2 | 5/2011 | Eom et al. | |
| 8,461,669 B2 | 6/2013 | Yang et al. | |
| 2005/0161793 A1 | 7/2005 | Ohno et al. | |
| 2007/0007639 A1 * | 1/2007 | Fukazawa ..................... 257/686 |
| 2007/0131940 A1 * | 6/2007 | Wu ....................... H01L 33/505 257/79 |
| 2008/0024102 A1 | 1/2008 | Hebert et al. | |
| 2008/0122063 A1 | 5/2008 | Akiba | |
| 2009/0014857 A1 * | 1/2009 | Hufgard ....................... 257/686 |
| 2009/0261462 A1 | 10/2009 | Gomez | |
| 2010/0090668 A1 | 4/2010 | Girdhar et al. | |
| 2010/0155878 A1 | 6/2010 | Hebert | |
| 2010/0155915 A1 | 6/2010 | Bell et al. | |
| 2011/0227207 A1 | 9/2011 | Yilmaz et al. | |
| 2011/0298114 A1 * | 12/2011 | Pruitt ............................ 257/676 |
| 2012/0193772 A1 | 8/2012 | Jiang | |

* cited by examiner

STACKED DIE POWER CONVERTER

RELATED APPLICATIONS

This application is a Continuation In Part of co-pending application Ser. No. 13/041,721 filed on Mar. 7, 2011, the entirety of which is hereby incorporated by reference.

FIELD

Disclosed embodiments relate to semiconductor power converter packages comprising stacked die assemblies.

BACKGROUND

Multi-die packaging is common in power converters in which Metal Oxide Semiconductor Field Effect Transistors (MOSFETs, which can have a doped polysilicon gate, generally referred to herein as simply FETs) which function as switching transistors are included. Motivations for multi-die packaging as opposed to a single monolithic integrated circuit (IC) solution include both performance and cost.

A conventional power converter package includes a lead frame having a first FET die and a second FET die in a side-by-side or lateral mounting arrangement on a common plane with a controller (or driver) die that is connected via bond wires between conductive pads on the controller die and to contacts on the respective lead frame portions, and by bond wires connected to various contact pads on the FETs. A first clip (also known as a strap), typically formed from copper in ribbon form, is in electrical and thermal contact with the upper surface of the second FET die and a second clip is in electrical and thermal contact with the upper surface of the first FET die. The first clip may be L-shaped and include a columnar portion that is in contact with a contact pad of the lead frame. The second clip is similarly shaped and is in contact with another portion of the lead frame. In typical power converter operations, the clips serve as current carrying conductors as well as heat sinks. This structure is typically encapsulated in a thermoset-based mold compound to define an IC circuit package.

The conventional lateral power converter package is generally thin, but has a foot print (e.g., 5 mm×7 mm) that may be too large for some applications. Moreover, parasitics (inductance and resistance) resulting from long bond wire connections may adversely limit performance including the frequency response (e.g., ringing) and maximum frequency performance. New solutions that minimize the area of power converter package while also providing improved performance are needed for applications including, but not limited to, highly dense servers, set-top boxes, industrial equipment, and notebook computers.

SUMMARY

Disclosed embodiments describe new multi-chip module (MCM) power converter packages that includes a stacked die power converter package, comprising: a lead frame including a die pad and a plurality of package pins; a first die including a first power transistor switch (first power transistor) attached to the die pad; a first metal clip attached to one side of the first die, the first metal clip coupled to at least one of the plurality of package pins; a second die including a second power transistor switch (second power transistor) attached to another side on the first metal clip; a second metal clip attached to one side of the second die, the first metal clip coupled to at least one of the plurality of package pins; a non-conductive layer applied to another side of the second metal clip, wherein the thickness and composition of the non-conductive layer is configured to provide a greater than 30V breakdown of the non-conductive layer; and a controller comprising a controller die attached to the non-conductive layer on the second metal clip; wherein the controller is coupled to both a first control node of the first power transistor and a second control node of the second power transistor.

In one embodiment the power converter package is a buck converter. In this embodiment the first power transistor comprises a low side (LS) power transistor and the second power transistor comprises a high side (HS) power transistor. Since the HS power transistor is generally significantly smaller in area as compared to the LS power transistor, for the embodiment where the controller is integrated on the same die with a power transistor, the controller is generally integrated with the HS power transistor.

As used herein the term "power transistor" or "power transistor switch" is used broadly, and includes, but is not limited to, III-V field effect transistors (FETs) including GaN FETs, CMOS switches (NMOS, PMOS), double-diffused metal-oxide-semiconductor (DMOS) FETs, junction gate field-effect transistors (JFETs), bipolar transistors, insulated gate bipolar transistor (IGBTs), trench FETs, and vertical field-effect transistors (VFETs).

When the term "die" is used herein, it is understood that a die can include one or more die, and each die can include a plurality of each of the transistor terminals, such a plurality of drains, sources, and gates hooked in parallel in the case of a power FET.

Disclosed embodiments provide close proximity of the controller to the respective power transistors which allows shortened connection paths that reduce the parasitic interconnect inductance and resistance. As a result, disclosed power converter packages are smaller, quieter and denser as compared to conventional power converters. Lower inductance leads to reduced ringing that provides benefits including (1) higher frequency switching and (2) safer and more robust drive.

BRIEF DESCRIPTION OF THE DRAWINGS

In the drawings, like reference numerals are sometimes used to designate like structural elements. It should also be appreciated that the depictions in the figures are diagrammatic and not to scale.

DETAILED DESCRIPTION

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Figure 1A:
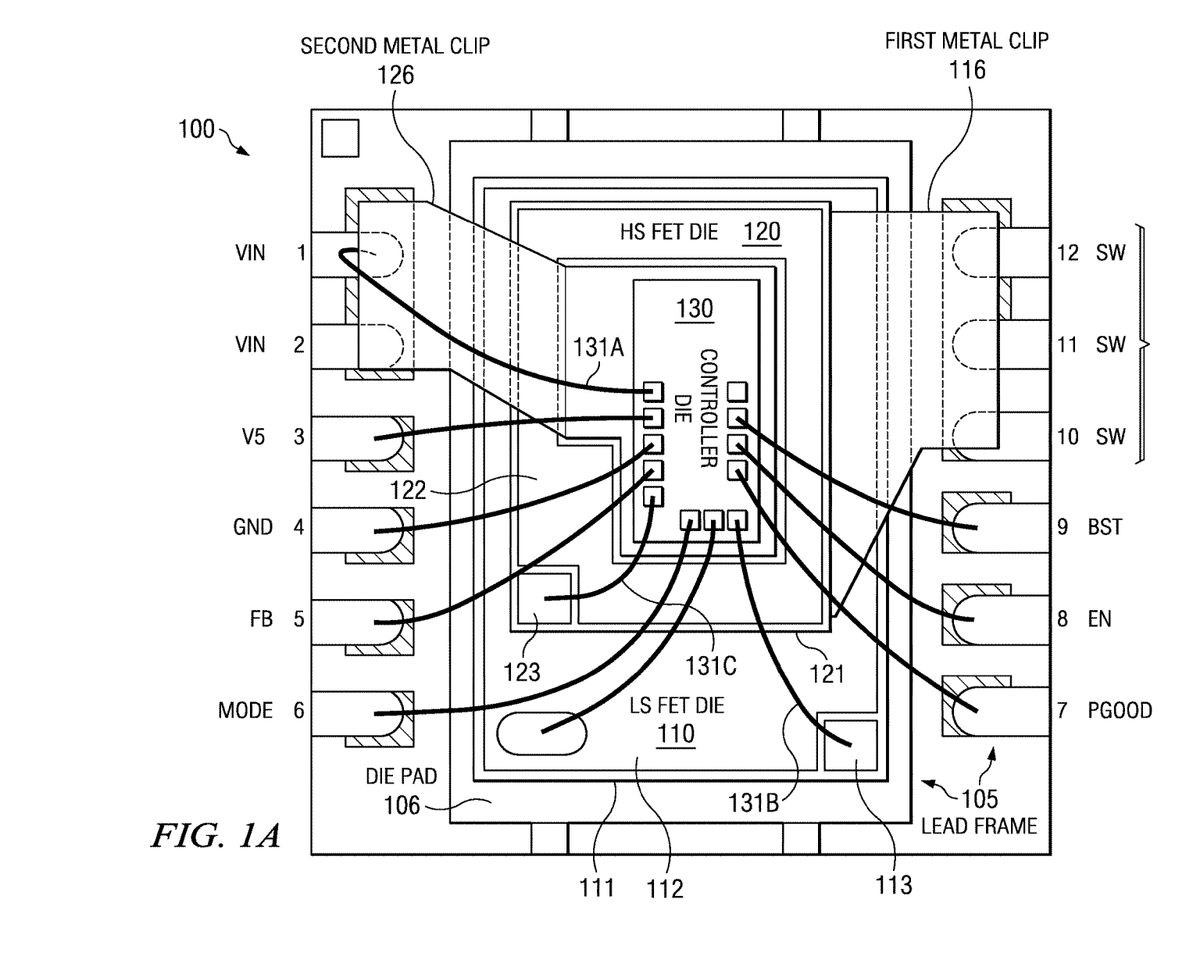
FIG. 1A is a plan view of an example dual-clip triple stack die power converter package including a LS n-channel FET (NFET) switch on a first die and a HS NFET switch on a second die, with a first metal clip between the first and second die, a second clip on the second die, and a controller die on the second clip, without the package molding to reveal features of the stacked die power converter, according to an example embodiment.

FIG. 1A is a plan view of an example dual-clip triple stack die power converter package 100 including a LS vertical NFET on a first die 110 and HS vertical NFET on a second die 120 stacked in series between $V_{IN}$ and GND with a switching (SW) or phase-node in between, with a controller die 130 on top of the second die, without the package molding to reveal features of the stacked die power converter, according to an example embodiment. Power converter package 100 includes a lead frame 105 including a die pad 106 and a plurality of package lead fingers/pins for input/output (I/O) connections numbered 1 through 12 in FIG. 1. Although twelve I/O connections are shown in FIG. 1A, a different number of I/O connections is possible, for example, 10 or 14.

A first vertical NFET die 110 identified in FIG. 1A as "LS FET die" 110 has a first source side 111, a first drain side 112 and a first gate contact 113 on the first drain side 112, which is attached first source side 111 down onto the die pad 106. For those having ordinary skill in the art, the physical die of a vertical FET has its source and drain built on the opposite surfaces of the die hence its device current flows in a direction perpendicular to the die surface. Since the HS vertical FET die 120 for disclosed embodiments is generally much smaller in size as compared to the LS FET die 110, a lower cost discrete FET die can be used for the HS FET die 120.

A first metal clip 116 is attached to the first drain side 112 of the LS vertical NFET die 110. First metal clip 116 generally comprises copper and may be attached with solder or another electrically conductive material such as a conductive epoxy (e.g., silver epoxy). The first metal clip 116 is shown coupling the drain on the first drain side 112 of LS vertical NFET die 110 to package pins 10 through 12 (shown as the switching node (SW)).

A second vertical NFET die 120 identified in FIG. 1A as a "HS FET die" 120 has a second source side 121 and a second drain side 122 and a second gate contact 123 on the second drain side 122, which is attached second source side 121 down onto the first metal clip 116.

A second metal clip 126, having a topside and a bottom side, is attached to the second drain side 122 of HS vertical FET die 120, and the second metal clip 126 is shown coupling the drain of HS vertical FET 120 die to package pins 1 and 2 (shown as the power input $V_{IN}$). The second metal clip has a non-conductive layer 135 on the topside, wherein the thickness and composition of the non-conducive layer 135 is configured to provide a breakdown voltage of the non-conducive layer 135 of greater than 30V.

The non-conducive layer 135 can be composed of non conductive materials such as Fiber glass filled resin or polyimide and the thickness of the insulating layer is controlled to minimize height of the power converter package while maintaining greater than 30 volt breakdown.

The controller die 130 is attached onto the second metal clip 126. In one embodiment, the controller die 130 comprises a low-dropout (LDO) controller that includes an open drain topology. The second clip 126 and the non-conducive layer 135 thereon provide a mounting area large enough to accommodate the controller die 130. The controller die 130 is generally mounted onto the non-conducive layer 135 on the second metal clip 126 using a dielectric adhesive, such as a non-electrically conductive epoxy.

Power converter package 100 is shown including a plurality of bondwires for coupling within the die stack. Bondwires shown include a bondwire 131A that couples a pad on the controller die 130 to $V_{IN}$, a bond wire 132B that couples a pad on the controller die 130 to the first gate contact 113 on the LS vertical FET die 110, and another bondwire 131C that couples a pad on the controller die 130 to the second gate contact 123 on the HS FET die 120. As described above, the proximity of the controller die 130 to the respective FET die 110 and 120 allows shortened bond wires that reduce the parasitic interconnect inductance and resistance. Lower inductance leads to reduced ringing that provides the benefits of (1) higher frequency switching and (2) safer and more robust drive. This low inductance feature can be especially important for the connections to the HS FET die 120.

Figure 1B:
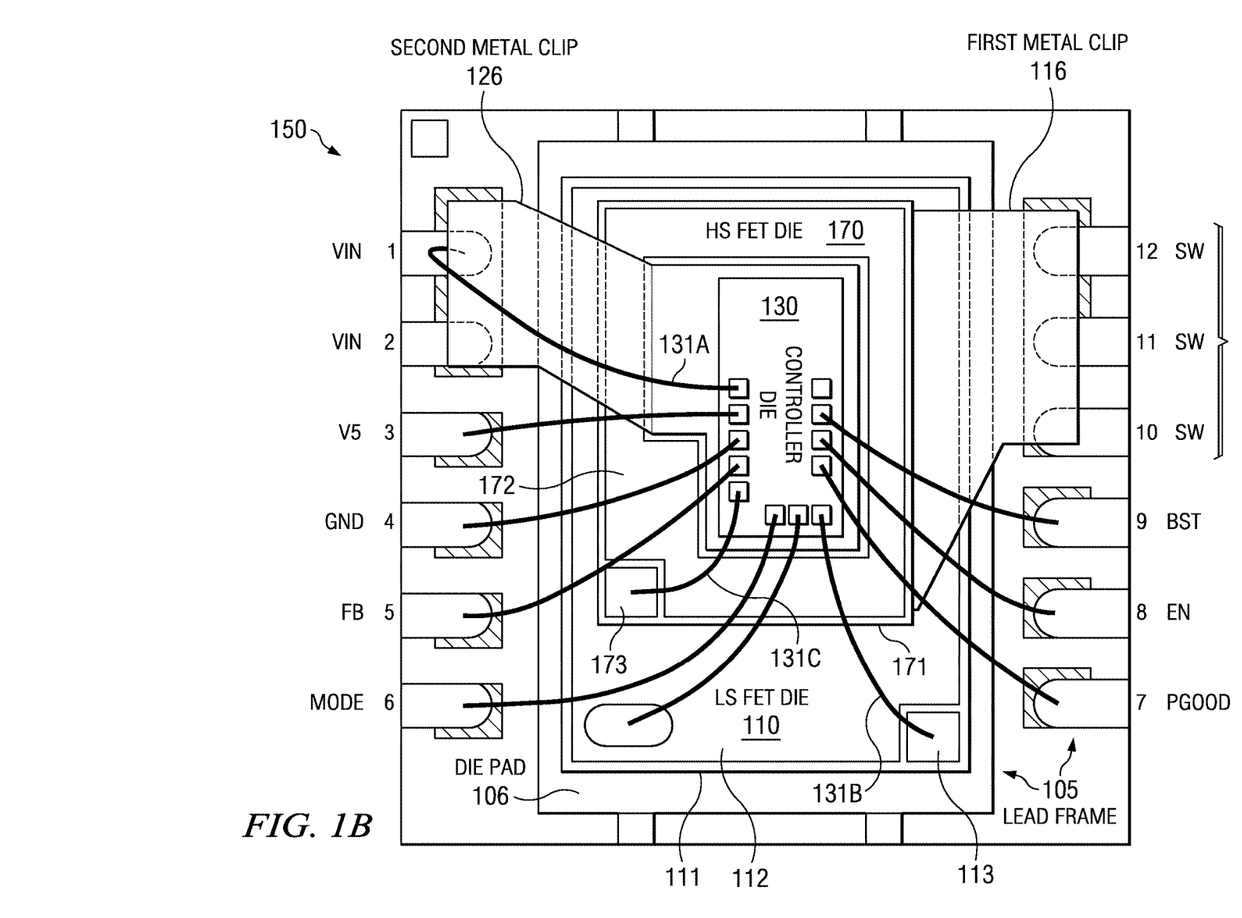
FIG. 1B is a plan view of an example dual-clip triple stack die power converter package including a LS NFET switch on a first die and a HS p-channel MOSFET (HS PFET) switch on a second die, with a first metal clip between the first and second die, a second clip on the second die, with a controller die on the second clip, without the package molding to reveal features of the stacked die power converter, according to an example embodiment.

FIG. 1B is a plan view of an example dual-clip triple stack die power converter package 150 including a first LS vertical NFET die 110 and a second HS vertical PFET die 170 stacked in series between $V_{IN}$ and GND with SW or phase-node in between, with a controller die 130 on the second metal clip 126 without the package molding to reveal features of the stacked die power converter, according to an example embodiment. Power converter package 150 is analogous to power converter package 100 except HS vertical NFET die 120 is replaced by HS vertical PFET die 170 that has a second drain side 171 and a second source side 172 and a second gate contact 173 on the second source side 172, which is attached second drain side 171 down onto the first metal clip 116, and bondwire 131C now couples a pad on the controller die 130 to the second gate contact 173 on the HS vertical PFET die 170.

Figure 2:
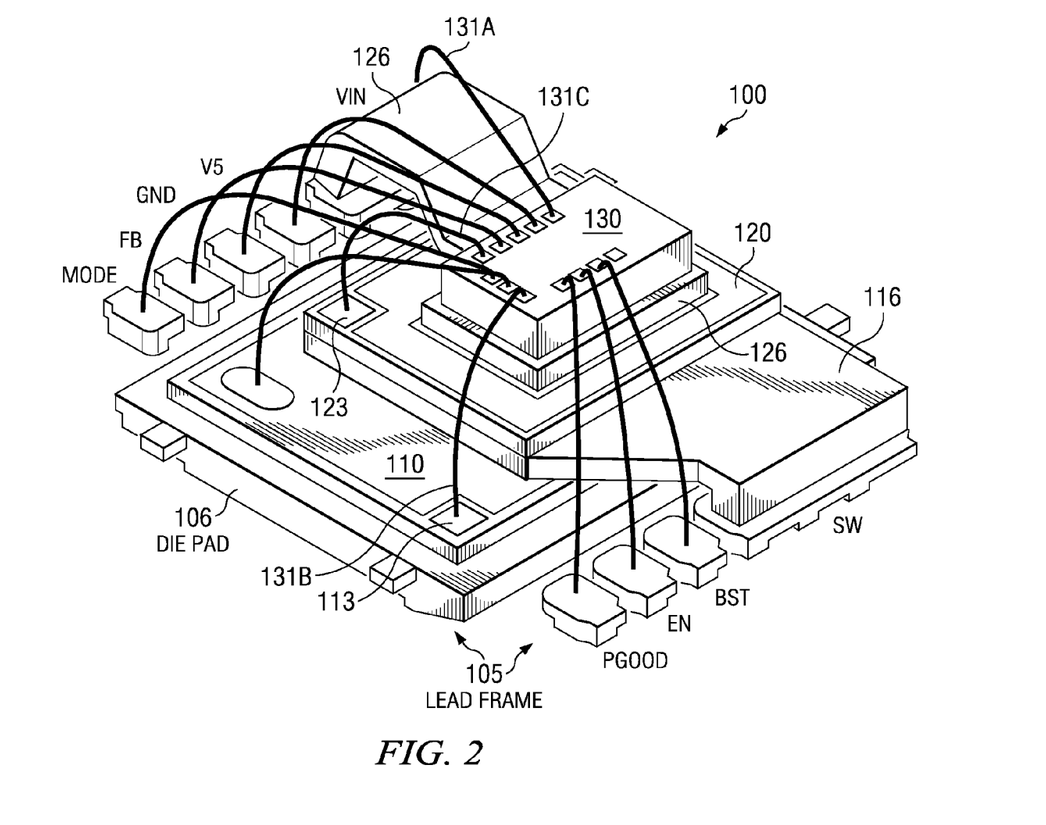
FIG. 2 shows a 3D depiction of the example dual-clip triple stack die power converter package shown in FIG. 1A, according to an example embodiment.

FIG. 2 shows a 3D depiction of the example dual-clip triple stack die power converter package 100 shown in FIG.

1A, according to an example embodiment. As noted above, although 12 pins are shown, disclosed embodiments may have more or less than 12 pins.

Figure 3:
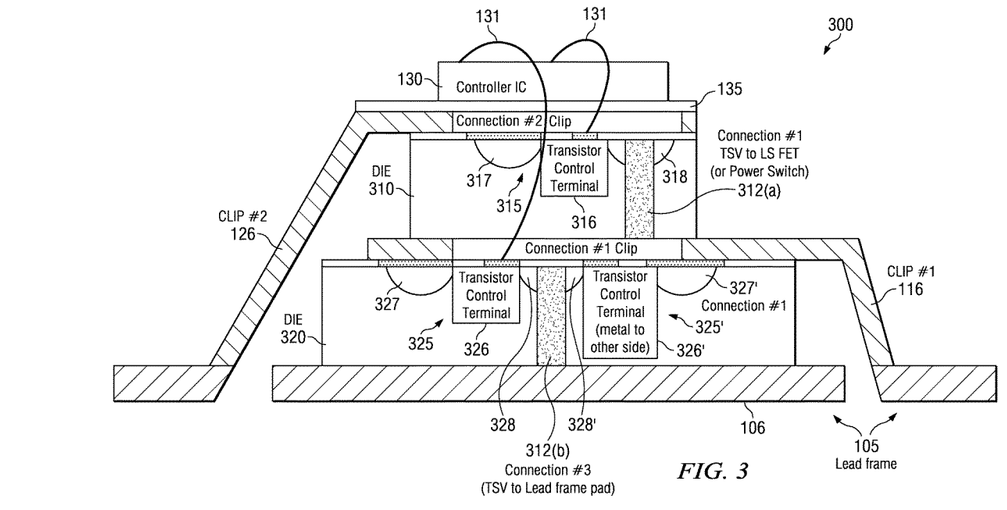
FIG. 3 is a cross sectional depiction of a power converter package that includes first and second power transistors on a first and second die that each comprise lateral power transistors and include at least one through substrate via (TSV), with a first metal clip between the first and second die, a second clip on the second die, and a controller die on the second clip with an insulating layer therebetween, according to an example embodiment.

FIG. 3 is a cross sectional depiction of a power converter package 300 that includes first and second power transistors on a first die 320 and a second die 310 that each comprise lateral power transistors and include at least one Through Silicon Via (TSV), with a first metal clip 116 between the first and second die, a second metal clip 126 on the second die 310, with a controller die 130 on the non-conducive layer 135 applied to top surface of the second clip 126, according to an example embodiment. For example, the lateral transistors can comprise DMOS transistors. The HS power transistor shown as a second lateral transistor 315 includes a control node 316 and two other nodes 317 and 318, such as a gate as a control node 316 and source and drain nodes 317, 318 for a FET on second die 310 including at least one TSV 312(a). TSV 312(a) is coupled to node 318 (such as by metallization on the topside of the die), and TSV 312(a) provides coupling through the full thickness of the second die 310 to the first metal clip 116.

Node 317 is coupled by second metal clip 126 to a pin of the lead frame 105. Metal clips such as second metal clip 126 can be soldered to pins of the lead frame 105. The LS power transistor on first die 320 is shown as a pair of first lateral transistors 325 and 325'. Lateral transistor 325 includes a control node 326, and two other nodes 327 and 328, such as a gate as a control node 326 and source and drain nodes 327, 328 for a FET, while lateral transistor 325' includes control node 326', and two other nodes 327' and 328', such as a gate as a control node 326' and source and drain nodes 327', 328' for a FET on first die 320. Control nodes 326 and 326' are connected together by metal (not shown) on a topside of the first die 320. First die 320 includes at least one TSV 312(b) that couples nodes 328, 328' to the die pad 106. The first clip 116 couples nodes 327, 327' to a pin of the lead frame 105. The controller die 130 is attached to the non-conducive layer of the second metal clip 126. Bond wires 131 are shown coupling controller die 130 to control nodes 316 on second die 310 and control nodes 326/326' on first die 320.

Figure 4:
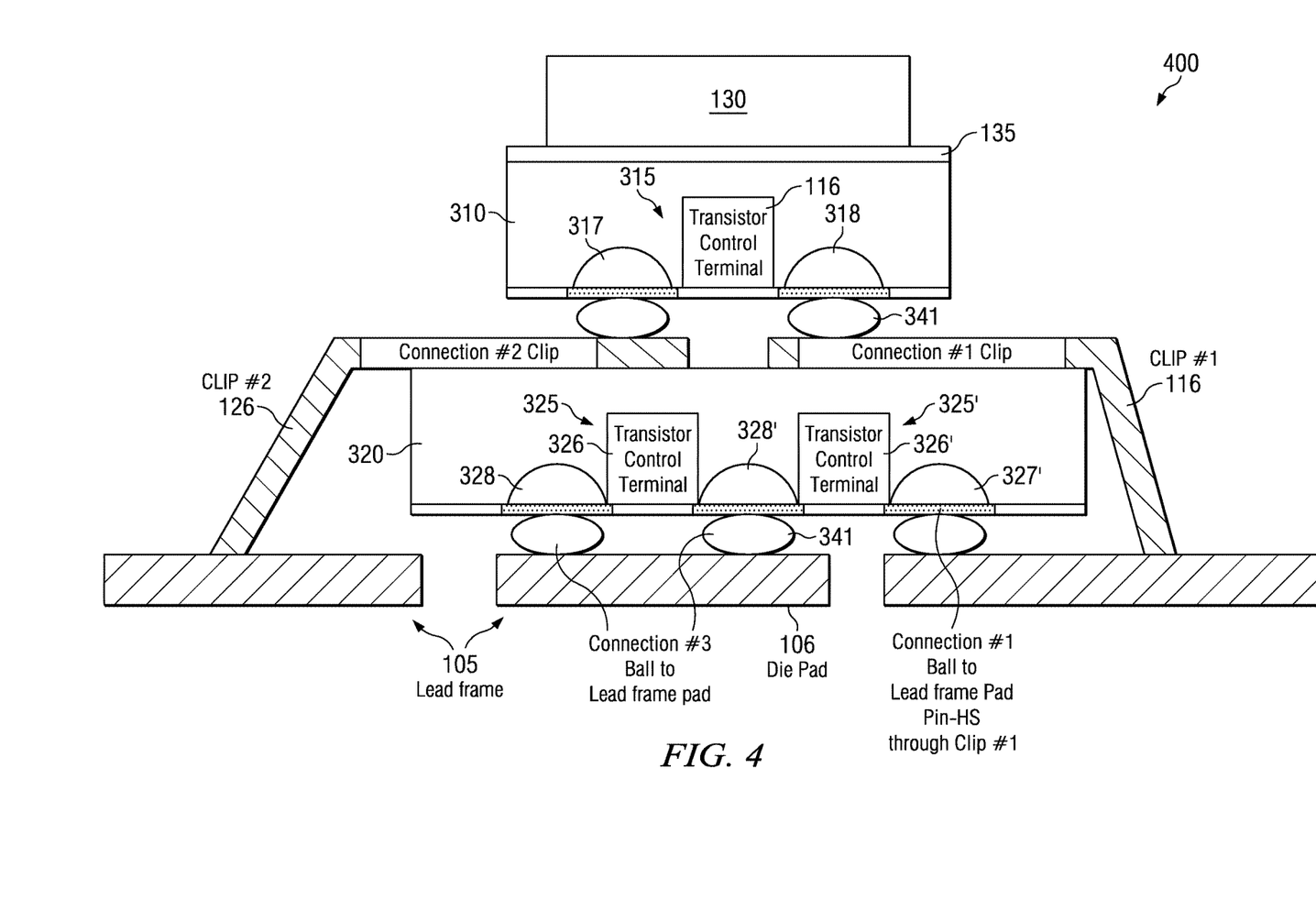
FIG. 4 is a cross sectional depiction of a power converter package that includes first and second power transistors on a first and second die that each comprise lateral power transistors, where the first die is flip chip mounted to a lead frame and the second die is flip chip mounted to both a first and a second metal clip that are lateral to one another in a region between the first die and the second die, and a controller die is attached to the second die, according to an example embodiment.

FIG. 4 is a cross sectional depiction of a power converter package 400 that includes first and second power transistors on a first and second die that each comprise lateral power transistors, where the first die 320 is flip chip mounted to a lead frame 105 and the second die 310 is flip chip mounted to both a first metal clip 116 and a second metal clip 126 that are lateral to one another in a region between the first die 320 and the second die 310, and a controller die 130 is attached to the second die, according to an example embodiment. Wire bonds are not shown in FIG. 4 for clarity, such as wire bonds for connecting nodes on the controller die 130 to the outside world. The LS power transistor on first die 320 is shown as a pair of first lateral transistors 325 and 325'. Bond wires that connect the controller die 130 to the respective control nodes 316 and 326/326' are not shown for clarity. Although not shown, control nodes 316 and 326/326' include ball terminals facing into the page to allow landing of solder balls 341.

The LS lateral transistors 325 and 325' on first die 320 include protruding bonding features shown as solder balls 341 that couple non-control nodes 328 and 328' to the die pad 106 and non-control nodes 327/327' to a package pin of lead frame 105. The HS lateral transistor 315 on second die 310 and includes solder balls 341 that couple a non-control node 317 to second metal clip 326 and a non-conducive layer 135 on the backside of the die, wherein a non-control node 318 is connected to the first metal clip 316. Metal posts/pillars, such as copper pillars may be use instead of the solder balls 341 shown. The controller die 130 is attached to the non-conducive layer on the second die 310, such as by a dielectric adhesive (e.g., epoxy).

Figure 5A:
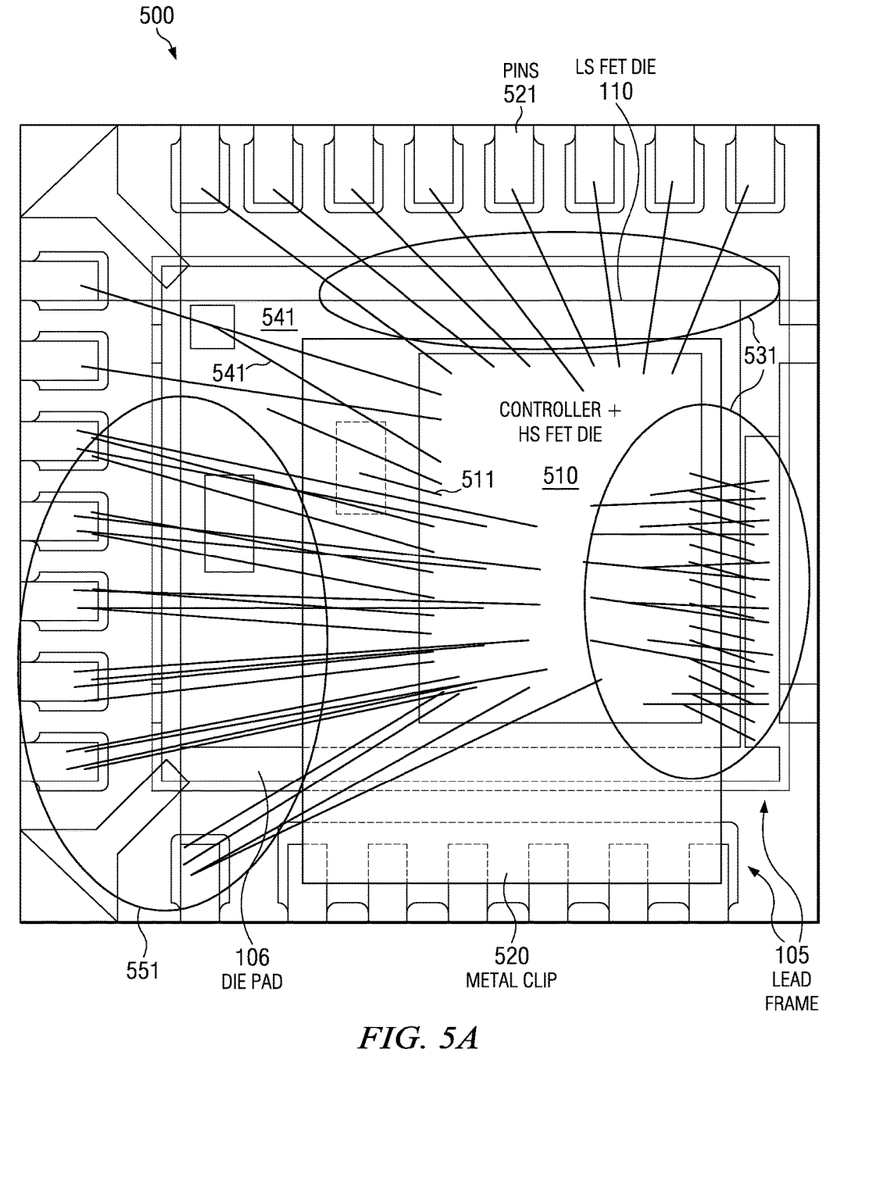
FIG. 5A is a plan view of an example stacked die power converter package including a controller integrated on the same die as one of the power transistors that includes wire bond interconnects, without the package molding to reveal features, according to an example embodiment.

In embodiments described below relative to FIGS. 5A and 5B, the controller is integrated with the HS power transistor on the second die. FIG. 5A is a plan view of an example stacked die power converter package 500 including a top die 510 including both a monolithic controller and HS vertical FET that is on a metal clip 520 that is on a die pad 106 of a lead frame 105, without the package molding to reveal features, according to an example embodiment. Wire bonds 531 from the top die 510 to the metal clip 520 provide the connection to the source of the vertical LS FET 110, wire bonds 511 from the top die 510 to pins 521 of lead frame 105 provides the connection to the drain of LS FET 110, and wire bonds 541 from the top die 510 provides the connection to the gate of LS FET 110. Wire bonds 551 from the top die 510 provides the connection to the VIN.

Figure 5B:
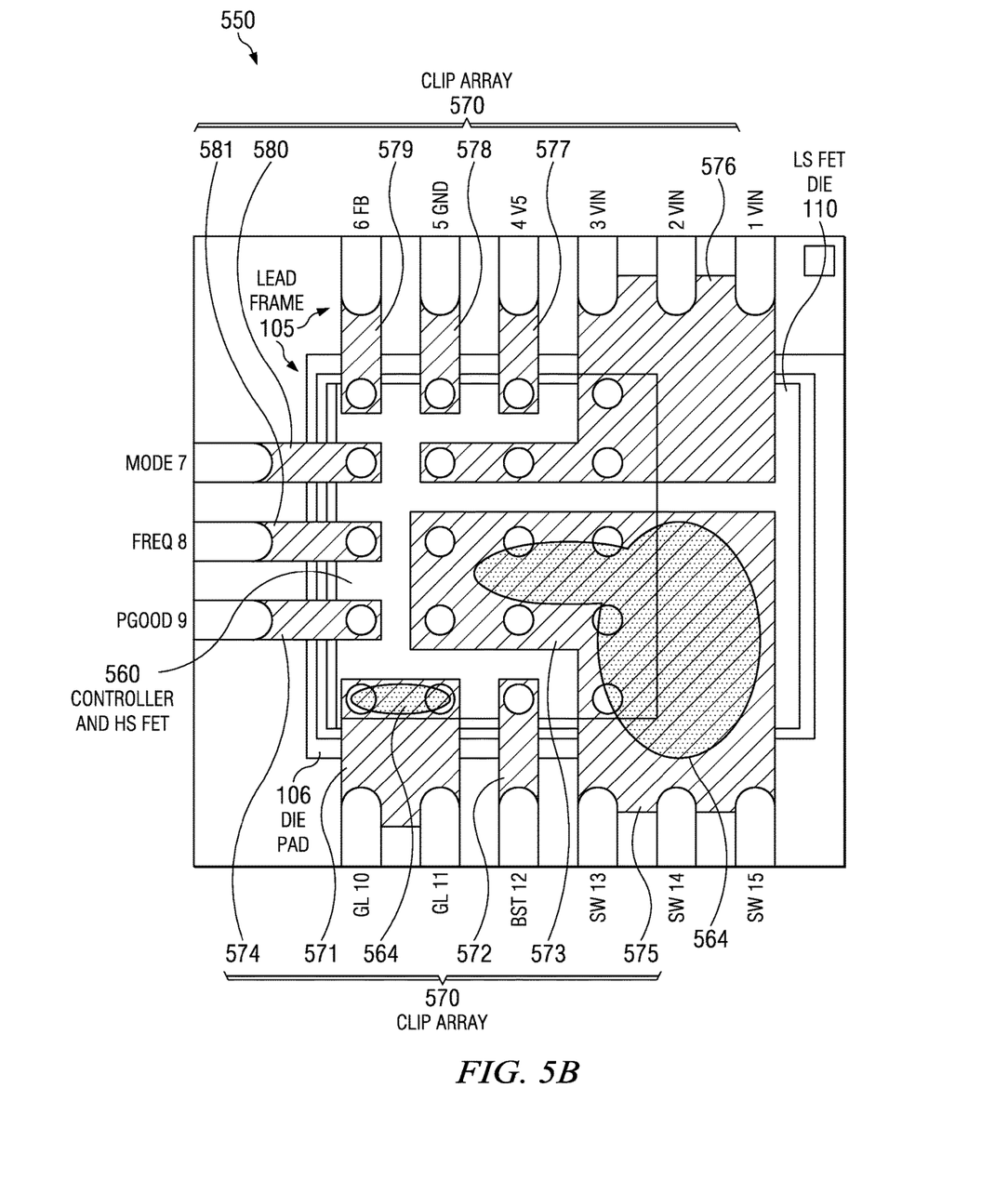
FIG. 5B is a plan view of an example stacked die power converter package including a controller integrated on the same die as one of the power transistors that utilizes flip chip on a clip to avoid the need for any wire bond interconnects, without the package molding to reveal features, according to an example embodiment.

FIG. 5B is a plan view of an example stacked die power converter package 550 including a top die 560 including both a monolithic controller and HS vertical FET thereon on a metal clip array 570 comprising a plurality of clip portions 571-581 that is on a die pad 106 of a lead frame 105, without the package molding to reveal features, according to an example embodiment. Top die 560 can be a wafer chip scale package (WCSP) die having solder balls that allows the flip chip attachment shown to the plurality of clip portions 571-581. Clip portions, such as portions 572, 574 and 577-581, are I/O stubs. Solder blobs 564 are shown soldering SW Clip 575 and GL clip 571 to lead frame 105 and to LS FET 110, respectively. In stacked die power converter package 550 LS FET 110 is used as an connector/interposer. Since power converter package 550 does not have any bond wires it provides shorter connections which provides very low parasitics including low inductance. Moreover, power converter package 550 provides a low cost single clip assembly flow as described in the paragraph below.

Regarding assembly for stacked die power converter package 550 for vertical power FET embodiments, the lead frame 105 goes through the assembly and the LS FET die 110 is attached to the die pad 106. The lead frame 106/LS FET 110 combination then goes through the assembly process again, this time the SWN clip 575 and GL clips 571 are added and soldered down to the LS FET 110 and to pins of the lead frame 105. Then, the VIN clip 576 and I/O clips such as 577-581 are soldered to the lead frame 105 on the third pass. It is noted that the VIN clip 576 and I/O clips are not soldered to the LS FET 110. Lastly, the top die 560 which can be embodied as a WCSP die is flipped onto the all the clips and stubs provided by clip array 570, thus making connections to SWN, VIN, GL and the I/Os.

An example method of assembling a dual-clip triple stack die power converter, such as dual-clip triple stack die power converter package 100 shown in FIG. 1A, is now described. Although described as a single lead frame assembly, the assemblies are typically performed using lead frame sheets so that a plurality of power device packages are assembled simultaneously.

A first side of a first die including a first power transistor is attached onto a die pad of a lead frame. One side of a first metal clip is coupled to a second side of the first die. A second die including a second power transistor is attached to a second side of the first metal clip. A second metal clip is attached to the first side or the second side of said second die and a non-conducive layer is either applied or laminated to the second metal clip. The non-conductive layer on the second metal clip can be applied before assembly or during the assembly process. A controller die is attached onto the non-conducive layer on the second metal clip or the non-conducive layer on the second die. The controller die is generally attached with a dielectric adhesive, such as a non-conductive epoxy. For embodiments where the controller die is attached to the second metal clip and the non-conducive layer thereon, the second metal clip provides a mounting area large enough to accommodate a controller die. The first metal clip and second metal clip are each bonded to at least one of a plurality of package pins of the lead frame. The controller die is coupled to a first control node on the first power transistor and to a second control node on the second power transistor, such as by wire bonding. The assembly process is then completed including molding for encapsulation.

Significantly, the disclosed assembly provides for alignment of the second metal clip and the controller die. This alignment extends the available space for the controller die and provides a strip carrier that allows the die pick and place machine to be used more efficiently since the same machine that allows the leadframe to go through the assembly is the machine that also installs the clips, so that a conventional bowl feed is not required.

For example, the lead frame goes through assembly, and the LS FET is attached to the lead frame. Then the lead frame/LSFET goes through assembly again, this time with one of the clip arrays mounted on top of the lead frame/LSFET array. For the disclosed triple stack embodiment, the HSFET is placed on the SWN (LSFET) clip and then the lead frame/LSFET/Clip 1/HSFET goes through assembly again, this time with a new clip array mounted to the whole assembly. The non-conductive layer on the second clip is applied either before or after assembly. Then, the controller die is placed on the HSFET clip. Thus, for each pass, the clip assembly can go through the lead frame assembly process. Therefore, machine requiring different alignment for clips needed for a conventional bowl clip process is not required. The lead frame process also self-aligns all mechanical elements.

In one embodiment, disclosed stack die power converter packages are used to configure a synchronous buck converter. However, disclosed embodiments can generally be applied to any power switching topology with three (or more) semiconductor elements. Examples include boost, buck-boost, and Cuk power converters. Disclosed embodiments can also be used in certain isolated converters, with only one side at a time. Examples include the primary side a two-switch forward converter or two switch flyback converter where the three die in the MCM power package are the two switches and the controller. Also, disclosed embodiments can be used on the secondary side of any converter with two switches on the secondary (forward converter is an example here) where two power transistor switches are required. The control IC could either be a full secondary control IC or a simpler synchronous rectifier control.

In one realization of disclosed embodiments, based on power converter package 100 shown in FIG. 1A, a functional density of 1.38 A/mm$^2$ of board area was found to be provided, which is an improvement over 300% over a conventional all lateral die arrangement. The height of the example triple-stack converter was between 1.2 mm and 1.5 mm, allowing use for a wide array of applications where customers need a ~15 A converter, since the inductor height for these circuits is generally at least 2 mm. Also, because the lead frame and plastic volume of the power converter package is considerably smaller in size, the triple stack approach can be cheaper than the traditional lateral MCM approach.

Disclosed embodiments can be integrated into a variety of assembly flows to form a variety of different packaged semiconductor devices and related products. The assembly can comprise single die or multiple die, such as PoP configurations comprising a plurality of stacked die. A variety of package substrates may be used. The active circuitry formed on the die including the controller comprises circuit elements that may generally include transistors, diodes, capacitors, and resistors, as well as signal lines and other electrical conductors that interconnect the various circuit elements. Disclosed embodiments can be integrated into a variety of process flows to form a variety of devices and related products. Moreover, disclosed embodiments can be used in a variety of semiconductor device fabrication processes including bipolar, CMOS, BiCMOS and MEMS processes.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

We claim:

1. A stacked die power converter package, comprising:
   a lead frame including a die pad and a plurality of package pins;
   a first die including a first power transistor switch (first power transistor) attached to the die pad;
   a first metal clip attached to one side of the first die, the first metal clip coupled to at least one of the plurality of package pins;
   a second die including a second power transistor switch (second power transistor) attached to another side on the first metal clip; wherein said first power transistor comprises a low side power transistor (LS power transistor) and said second power transistor comprises a high side power transistor (HS power transistor), and said power converter package comprises a buck converter, and wherein said HS power transistor comprises a second lateral transistor on said second die, said second die including at least one through silicon via (TSV) that couples a non-control node of said second lateral transistor to said first metal clip, and wherein said LS power transistor comprises a first lateral transistor on said first die, said first die including at least one TSV that couples a non-control node of said LS power transistor to said die pad;
   a second metal clip attached to one side of the second die, the first metal clip coupled to at least one of the plurality of package pins;
   a non-conductive layer applied to another side of the second metal clip, wherein the thickness and composition of the non-conductive layer is configured to provide a greater than 30V breakdown voltage of the non-conductive layer; and
   a controller comprising a controller die is attached to the non-conductive layer on the second metal clip wherein the controller is coupled to both a first control node of the first power transistor and a second control node of the second power transistor.

2. The power converter package of claim 1, wherein nodes on said HS power transistor and nodes on said controller die are coupled to nodes on said LS power transistor and to respective ones of said plurality of package pins by bond wires.

3. The power converter package of claim 1, wherein the composition of the non-conductive layer is either fiber glass filled resin or polyimide.

4. The IC package of claim 1, wherein the IC package includes a buck converter.

5. The IC package of claim 1, wherein the controller die is directly connected to the first control node and the second control node via bond wires.

6. The IC package of claim 1, wherein the non-conductive layer includes one of a fiber glass filled resin and polyimide.

7. The IC package of claim 1 further comprising a lead frame including a die pad and a plurality of package pins, wherein the first die is on the die pad.

8. The IC package of claim 7, wherein the first metal clip and the second metal clip are coupled to the plurality of package pins.

9. The IC package of claim 1, wherein the non-conductive layer has a thickness to provide a greater than 30V breakdown voltage of the non-conductive layer.

10. An integrated circuit (IC) package comprising:
a first die including a first power transistor;
a first metal clip having a first side attached to an upper side of the first die;
a second die including a second power transistor, a first side of the second die attached to a second side of the first metal clip, said second die having a smaller surface area than the first die;
a second metal clip having a first side attached to a second side of the second die;
a non-conductive layer attached to a second side of the second metal clip; and
a controller die, attached to the non-conductive layer, and including a direct electrical connection to both a first control node of the first power transistor on the upper side of the first die and a second control node of the second power transistor on the second side of the second die, said controller die having a smaller surface area than that of the second die; wherein the first power transistor is a low side power transistor and the second transistor is a high side power transistor of the buck converter, wherein the second die includes a second lateral transistor, and a first through silicon via couples a non-control node of the second lateral transistor to the first metal clip; and wherein the first die includes a first lateral transistor, and wherein a second through silicon via couples a non-control node of the low side power transistor to the die pad.

* * * * *